(12) United States Patent
Scharkowski

(10) Patent No.: US 11,167,371 B2
(45) Date of Patent: Nov. 9, 2021

(54) METHOD AND DEVICE FOR ESTABLISHING A SHIELD CONNECTION OF A SHIELDED CABLE

(71) Applicant: Auto-Kabel Management GmbH, Hausen i.W. (DE)

(72) Inventor: Oliver Scharkowski, Schenkendöbern OT Atterwasch (DE)

(73) Assignee: Auto-Kabel Management GmbH, Hausen i.W. (DE)

( * ) Notice: Subject to any disclaimer, the term of this patent is extended or adjusted under 35 U.S.C. 154(b) by 0 days.

(21) Appl. No.: 16/762,765

(22) PCT Filed: Aug. 15, 2018

(86) PCT No.: PCT/EP2018/072086
§ 371 (c)(1),
(2) Date: May 8, 2020

(87) PCT Pub. No.: WO2019/091613
PCT Pub. Date: May 19, 2019

(65) Prior Publication Data
US 2020/0376589 A1  Dec. 3, 2020

(30) Foreign Application Priority Data

Nov. 13, 2017  (DE) .................... 10 2017 126 530.9

(51) Int. Cl.
*B23K 20/06* (2006.01)
*H01B 13/26* (2006.01)
(Continued)

(52) U.S. Cl.
CPC ......... *B23K 20/06* (2013.01); *H01B 13/2646* (2013.01); *B23K 2101/32* (2018.08);
(Continued)

(58) Field of Classification Search
CPC ...... B23K 20/10; B23K 20/06; B23K 20/103; B23K 2103/32; B23K 2101/38; H01B 13/2646; H01B 13/2606
See application file for complete search history.

(56) References Cited

U.S. PATENT DOCUMENTS 4,558,918 A  12/1985  Shores
5,981,921 A  11/1999  Yablochnikov
(Continued)

FOREIGN PATENT DOCUMENTS

DE  19902122 A1  7/2000
DE  102007021846 A1  11/2008
(Continued)

OTHER PUBLICATIONS

European Patent Office, International Search Report and Written Opinion of the International Searching Authority, Application No. PCT/EP2018/072086, dated Dec. 7, 2018, with English translation of the search report, 14 pages.
(Continued)

*Primary Examiner* — Brian W Jennison
(74) *Attorney, Agent, or Firm* — Sunstein LLP

(57) ABSTRACT

Method for forming a shield connection of a shielded cable with the steps of pushing a sleeve onto a shield of a cable, inserting the cable with the sleeve into a magnetic pulse welding coil, and energizing the magnetic pulse welding coil with a current pulse in such a way that the sleeve is joined to the shield with a material bond.

12 Claims, 3 Drawing Sheets

(51) Int. Cl.
*B23K 101/32* (2006.01)
*B23K 103/10* (2006.01)
*B23K 101/38* (2006.01)
*H05K 9/00* (2006.01)

(52) U.S. Cl.
CPC ...... *B23K 2101/38* (2018.08); *B23K 2103/10* (2018.08); *H01B 13/2606* (2013.01); *H05K 9/0098* (2013.01)

(56) References Cited

U.S. PATENT DOCUMENTS

| | | | |
|---|---|---|---|
| 6,229,125 | B1 | 5/2001 | Livshiz et al. |
| 6,452,102 | B1* | 9/2002 | DeForest, Jr. ....... H01R 13/405 174/750 |
| 2001/0016459 | A1* | 8/2001 | Livshiz ................. B21D 26/14 439/877 |
| 2008/0277931 | A1 | 11/2008 | Poschenrieder et al. |
| 2010/0216356 | A1 | 8/2010 | Takehara |
| 2013/0199841 | A1* | 8/2013 | Lehmann ................. H02G 1/14 174/75 R |
| 2014/0326501 | A1* | 11/2014 | Lienert ................. H01B 1/023 174/94 R |

FOREIGN PATENT DOCUMENTS

| | | |
|---|---|---|
| DE | 102010003599 A1 | 10/2011 |
| DE | 102012000137 A1 | 7/2013 |
| DE | 102013015302 A1 | 3/2015 |
| WO | WO 2008/104980 A2 | 9/2008 |

OTHER PUBLICATIONS

German Patent Offfice, Office Action, Application No. 10 2017 126 530.9, dated Apr. 23, 2020, 8 pages.

China National Intellectul Property Administration, Notification of the Second Office Action, Application No. 201880073447.8, dated Jul. 30, 2021, 9 pages (English translation).

* cited by examiner

METHOD AND DEVICE FOR ESTABLISHING A SHIELD CONNECTION OF A SHIELDED CABLE

CROSS-REFERENCE TO RELATED APPLICATIONS

This application is the national phase entry of international patent application no. PCT/EP2018/072086 filed Aug. 15, 2018 and claims the benefit of German patent application No. 10 2017 126 530.9, filed Nov. 13, 2017, the disclosures of which are incorporated herein by reference in their entirety.

TECHNICAL FIELD

The subject-matter relates to a method of establishing a shield connection of a shielded cable and a device therefor as well as a cable manufactured by means of the method.

BACKGROUND ART

Due to the increasing share of hybrid and electric vehicles and the associated electrification of the drivetrain, the requirements for so-called high-voltage cables are growing. High-voltage cables are cables with large cable cross sections, which have a current carrying capacity of several 100 A and a dielectric strength of several 100V to several 1000V. Due to the high voltages and currents in the high-voltage cables, the electromagnetic flow of the cable is an essential component. The electromagnetic compatibility of the current-carrying cables in high-voltage applications must be ensured and any influence on other electrical components must be reliably avoided.

The electromagnetic radiation is shielded by a shield surrounding the conductor of the cable. The shield must be uninterruptedly connected to the same electrical potential, especially ground, throughout the length of the current-carrying components to ensure reliable shielding of the electromagnetic radiation. However, this also means that the shield must be intact not only along the cable harness, but also at transitions between two cables and at cable entry points into housings and the like. Such cable entry points must ensure a reliable shield contact. Since the shield is usually made of foils and/or braiding, the connection to other shields is complex from a processing point of view. For this reason, it has already been suggested to contact the shield with a sleeve and then use the sleeve as shield contact.

Various techniques are known for contacting the sleeve to the shield, as described for example in DE 10 2007 051 836 A1 or DE 10 2002 60 897 B4. However, the connection methods described there involve a complex manufacturing effort. Known methods are often based on a form fit and/or frictional bond, whereby the long-term stability of these connections is questionable. Especially in automotive applications, where the connections are exposed to extreme environmental conditions, in particular mechanical vibrations as well as electrochemical attacks by electrolytes, a long-term stable contact between shield and sleeve is desired.

Therefore the subject-matter was based on the object of providing a shield connection that is long-term stable and can be produced in a reliable process, especially while maintaining short cycle times during production.

SUMMARY OF THE INVENTION

In the method according to the subject-matter, a sleeve is pushed onto the shield of a cable.

The cable is usually composed of an inner conductor, also called a core, an inner insulation, a shield and an outer insulation. The inner conductor can be a flat or round conductor and can be either be formed as a monolithic full material or be stranded.

The inner insulation insulates the inner conductor from the shield.

The shield is exposed and the sleeve is pushed directly onto the shield. The sleeve can be made of one or more parts, and can in particular have an upper and a lower part. The sleeve can be placed or pushed onto the cable or the shield.

After the sleeve has been pushed/placed onto the shield, the sleeve is temporarily fixed to the shield, for example by means of a holding arm or similar. A fixation can also be ensured by pushing the sleeve onto the shield in a press fit. In particular the inner insulation is elastically deformable and thereby allows the sleeve to be pushed on while simultaneously deforming the insulation, so that the sleeve is held securely to the shield by the restoring force of the insulation.

In order to easily push the sleeve onto the shield, the sleeve can have an opening which expands towards a front end of the sleeve. This allows the sleeve to be pushed onto the shield with the expanded end, and during the process of pushing on, the sleeve presses the shield against the insulation and is thus held securely to the shield.

The cable and sleeve are then inserted into a magnetic pulse welding coil using a suitable tool.

As soon as the cable and the sleeve are positioned in the magnetic pulse welding coil, the magnetic pulse welding coil is energized with an electric current pulse. The pulse has such a current value that the Lorentz force acting on the sleeve due to the eddy current induced in the sleeve is sufficient to deform the sleeve plastically and in particular to join it to the shield with a material bond.

Due to the high deformation speed caused by the very short pulse, cold welding occurs between the material of the shield and the material of the sleeve. In particular, the inner wall of the sleeve is joined to the shield.

A longitudinal section of the joining zone between the sleeve and the shield shows a wave-shaped weld pattern. Intermetallic contact zones are created between the metal sleeve and the metal of the shield.

To push the sleeve onto the shield, it is suggested that first of all an external insulation of the cable is removed in one area and then the sleeve is pushed onto this area. Removing the insulation exposes the shield so that the sleeve can be placed directly on the shield. In case the area where the insulation is removed is located between two ends of the cable and is surrounded by an external insulation on both sides, the sleeve is preferably made of multiple parts and can be placed radially on the shield from the outside. Here, the individual parts of the sleeve can be locked together by a corresponding mechanical design, so that the parts of the sleeve are arranged securely at the shield before the sleeve is joined to the shield with a material bond.

The current pulse with which the magnetic pulse welding coil is energized has a duration of less than 1 second, in particular less than 0.5 seconds, preferably in about 0.3 seconds or less. The pulse is preferably at least longer than 0.1 second.

For the short pulse duration, an energy storage in a pulse generator is discharged very quickly. This results in a large current, because the charge stored by the energy storage flows through the magnetic pulse welding coil in a very short time. In particular it is proposed that the pulse has a current intensity of at least 10 kA, preferably at least 100 kA. For this purpose, at least one capacitor is arranged in the pulse generator of which the charge is discharged in a pulse-like manner. The voltage can be 400 V, for example.

The high currents in the magnetic pulse welding coil lead to a large eddy current in the sleeve, which in turn causes a Lorentz force on the sleeve directed to the interior of the coil. This Lorentz force leads to a permanent, plastic deformation of the sleeve within a very short period of time, so that a cold welding between the sleeve and the shield is provided.

The magnetic pulse welding coil is preferably a toroidal coil. In order to ensure that the sleeve is welded circumferentially on the shield with approximately the same energy, it is proposed that the cable together with the sleeve is inserted into the magnetic pulse welding coil concentrically with the coil axis of the toroidal coil. This results in the Lorentz force being spread as evenly as possible along the circumference of the sleeve. This ensures that the plastic deformation of the sleeve is as uniform as possible and thus a material bond of the sleeve and the shield is as uniform as possible along the circumference of the inner surface of the sleeve shield.

As already explained, the sleeve is cold formed by the impulse. Due to the rapid cold forming, only a very low temperature is generated in the welding zone, which can be advantageous. Due to the pulse and the Lorentz force caused by it, the yield stress of the material of the sleeve is exceeded. The sleeve is thereby cold formed without contact. A high-speed collision between the inner surface of the sleeve and the shield occurs, so that a material bond between the sleeve and the shield is achieved almost without heating.

Preferably, the outer insulation of the cable is removed at one end of the cable and the sleeve is then pushed onto the cable or the shield from the end of the cable.

Another aspect is a magnetic pulse welding device with a magnetic pulse welding coil and a pulse generator. By means of a feeding device, the cable is inserted into the magnetic pulse welding coil with a sleeve pushed on. The magnetic pulse welding coil is preferably a toroidal coil and the feeding device is designed in such a way that the cable with the pushed-on sleeve is arranged in the centre of the magnetic pulse welding coil. Preferably, the longitudinal axis of the cable is collinear with the longitudinal axis of the magnetic pulse welding coil. This leads to an even pressure distribution on the sleeve at the moment of welding. There are then no tilting moments acting on the cable.

A further aspect is a cable with an inner conductor, an inner insulation surrounding the inner conductor, a shield surrounding the inner insulation, an outer insulation surrounding the shield, and a sleeve pushed onto an area freed from the outer insulation and surrounding the shield. The cable is characterized by a shield connection being ensured in such a way that the shield is welded to the sleeve in a material bond by means of magnetic pulse welding.

A particularly good connection between sleeve and shield is achieved when sleeve and shield are made of the same metal. Non-ferrous metals such as aluminium or copper and their respective alloys are particularly suitable. It is important that the material of the sleeve has a high conductivity. In this way, large eddy currents are generated in the sleeve, which means that the Lorentz force acting on the sleeve is large.

The inner conductor preferably has a round or rectangular cross-section and can therefore form a round cable or a flat cable. The inner conductor is especially formed as a stranded conductor or as a one-piece conductor.

The shield is preferably a metal mesh and/or a metal foil.

To adapt the sleeve to a cable entry point, it is suggested that the sleeve has an outer circumference that is adapted to a cable entry point. This can lead to the sleeve having an opening cross-section and an outer cross-section, the opening cross-section being different from the outer cross-section. The opening cross-section corresponds approximately to the cross-section of the inner cable, inner insulation and shield. This means that the sleeve can be pushed onto the shield with the opening cross-section.

An outer cross section deviating from the opening cross section, can ensure that the sleeve corresponds to a cable entry after the material bond joining and that a good shield connection is guaranteed.

BRIEF DESCRIPTION OF THE DRAWINGS

In the following, the object is explained in more detail by means of a drawing showing embodiments. In the drawing show.

DETAILED DESCRIPTION OF SPECIFIC EMBODIMENTS

Figure 1:
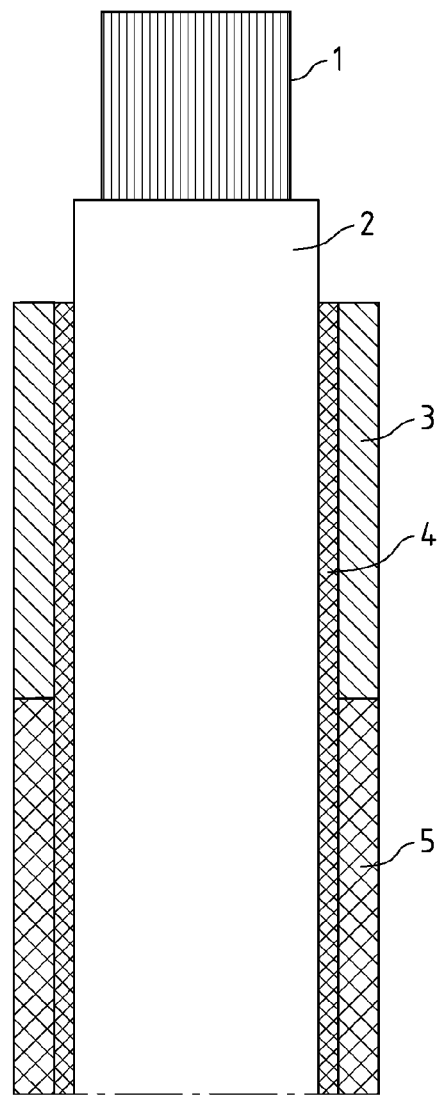
FIG. 1 a cable with sleeve,
FIG. 2 a cable inserted into a magnetic pulse coil.

FIG. 1 shows a cable with an inner conductor 1. The inner conductor 1 can be stranded or solid. The inner conductor 1 is preferably made of copper or an alloy thereof, but can also be made of aluminium or an alloy thereof. The cross-section of the inner conductor 1 is preferably round or rectangular.

A primary insulation 2 is provided around the inner conductor 1. The primary insulation 2 is made of an electrically insulating material.

A shield 4 is wound around the primary insulation 2. The shield 4 can be formed as metal foil or metal braiding or a combination of both.

The shield 4 surrounds a secondary insulation 5. The secondary insulation 5 can be made of the same material as the primary insulation 2.

It can be seen that at the front end of the cable the secondary insulation 5 has been removed from the shield 4. The shield 4 is exposed in an area of the end face. The sleeve 3 can be pushed onto this area. The sleeve 3 preferably has an inner diameter which corresponds to the outer diameter of the primary insulation 2 together with shield 4.

The sleeve 3 is preferably made of the same material as the shield 4. Especially copper or aluminium and their alloys are suitable.

Figure 2:
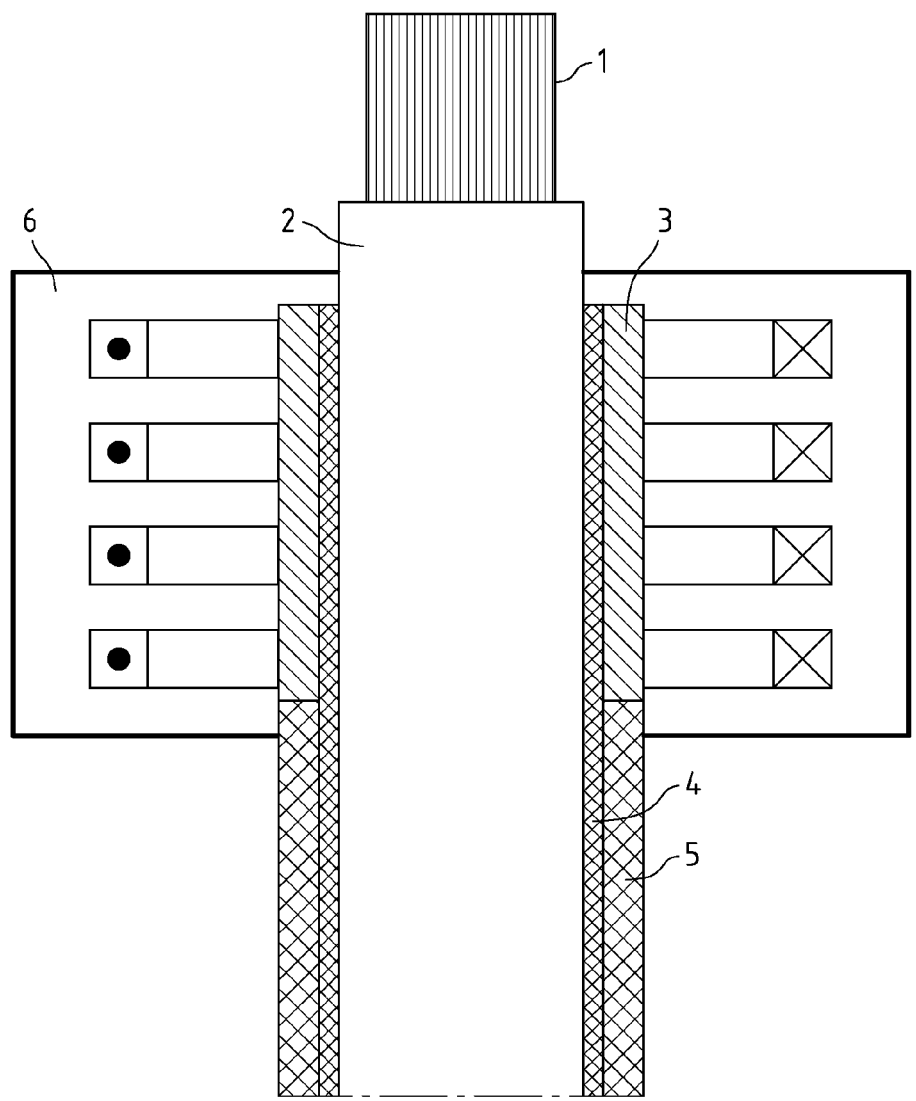

After the sleeve 3 has been pushed onto the shield 4, the cable is positioned by a feeding device in a magnetic pulse coil 6, as shown in FIG. 2. The magnetic pulse coil 6 has a plurality of windings and is in particular formed as a toroidal coil. The windings run around the cable. The cable is preferably collinear with its longitudinal axis to the longitudinal axis of the magnetic pulse coil 6.

It can be seen that the cable with the sleeve 3 is positioned at the inside of the magnetic pulse coil 6.

A short current pulse can be transmitted to the magnetic pulse coil 6 by a pulse generator, which in particular has at least one capacitor and an ohmic resistor as well as a switch. For this purpose the magnetic pulse coil 6 is short-circuited via the capacitor and the resistor. This causes the capacitor to discharge and the stored charge flows very quickly through the magnetic pulse coil 6, resulting in currents of up to several 100 kA.

The currents flowing in the coil 6 cause an eddy current in the sleeve 3. This creates a Lorentz force on the sleeve 3, which acts towards of the inside of the cable.

Figure 3:
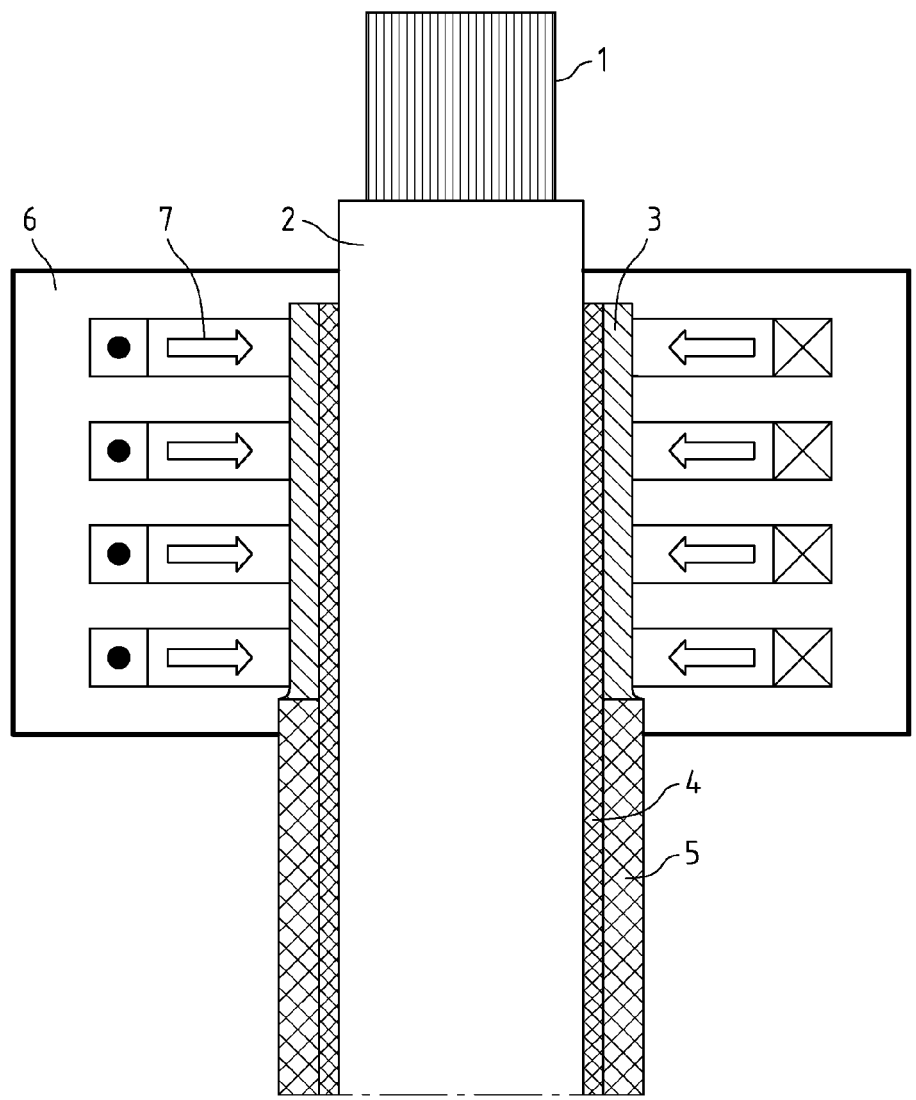
FIG. 3 a sleeve welded to a shield by a magnetic pulse.

By this Lorentz force, a cold forming of the sleeve 3 occurs, as shown in FIG. 3. The Lorentz force acts in direction 7 onto the sleeve 3 and the sleeve 3 is plastically deformed in fractions of a second and pressed onto the shield 4. The high acceleration creates an intermetallic connection between the inner wall of the sleeve 3 and the shield 4. Thereby the sleeve 3 is not only positively form fit and force fit to the shield 4, but also joined together with a material bond.

The cable is subsequently removed from the magnetic pulse coil 6 and the next cable can be inserted.

The cycle time is very short, as the welding is carried out in a very short period of time, especially in less than 1 second. The pulse generator can be charged while the cable is removed from the magnetic pulse coil 6 and a new cable is inserted. This duration may be sufficient to charge the pulse generator or its capacitors with a sufficient charge, so that in the next step a sufficient Lorentz force acts on the sleeve 3 again.

With the aid of the method and the device shown, long-term stable connections between sleeves and shield can be established in a process-safe manner.

What is claimed is:

1. Method for establishing a shield connection of a shielded cable comprising:
    pushing a sleeve onto a shield of a cable;
    inserting the cable with the sleeve into a magnetic pulse welding coil; and
    energizing the magnetic pulse welding coil with a current pulse in such a way that the inner wall of the sleeve is joined with the shield with a material bond.

2. Method of claim 1, wherein an outer insulation of the cable is removed in one area and the sleeve is pushed onto the one area.

3. Method of claim 1, wherein the pulse has a duration of less than one second.

4. Method of claim 1, wherein the pulse has a current of at least 100 kA.

5. Method of claim 1, wherein the magnetic pulse welding coil is a toroidal coil and the cable with the sleeve is inserted into the magnetic pulse welding coil concentrically with the coil axis of the toroidal coil.

6. Method of claim 1, wherein the sleeve is cold-formed by the pulse.

7. Method of claim 1, wherein an outer insulation of the cable is removed at one end of the cable.

8. A cable comprising:
    an inner conductor;
    an inner insulation surrounding the inner conductor;
    a shield surrounding the inner insulation;
    an outer insulation surrounding the shield;
    a sleeve surrounding the shield pushed onto an area freed from the outer insulation, an inner wall of the sleeve being adjacent the shield wherein the shield is welded as a material bond to the inner wall of the sleeve using magnetic pulse welding.

9. The cable of claim 8, wherein the sleeve and the shield are made of the same metal, in particular from aluminium or alloys thereof or from copper or alloys thereof.

10. The cable of claim 8, wherein at least the inner conductor has a round or a rectangular cross-section.

11. The cable of claim 8, wherein the shield is formed from a metal braid and/or a metal foil.

12. The cable of claim 8, wherein the sleeve has an opening cross-section and an outer cross-section, wherein the opening cross-section is different from the outer cross-section.

* * * * *